US006180270B1

(12) United States Patent
Cole et al.

(10) Patent No.: US 6,180,270 B1
(45) Date of Patent: Jan. 30, 2001

(54) LOW DEFECT DENSITY GALLIUM NITRIDE EPILAYER AND METHOD OF PREPARING THE SAME

(75) Inventors: Melanie Cole, Churchville, MD (US); Kezhou Xie, Edison, NJ (US)

(73) Assignee: The United States of America as represented by the Secretary of the Army, Washington, DC (US)

( * ) Notice: Under 35 U.S.C. 154(b), the term of this patent shall be extended for 0 days.

(21) Appl. No.: 09/065,690

(22) Filed: Apr. 24, 1998

(51) Int. Cl.[7] ...................................................... G32B 9/00
(52) U.S. Cl. ........................ 428/698; 428/212; 427/372.2
(58) Field of Search .................... 428/627, 698, 428/212; 257/76; 427/372.2

(56) References Cited

U.S. PATENT DOCUMENTS

| 5,122,845 | * | 6/1992 | Manabe et al. | 357/17 |
| 5,880,485 | * | 3/1999 | Marx et al. | 257/94 |

OTHER PUBLICATIONS

Thermal Stability of W Ohmic Contracts to n–type GaN, pp. 278–281, pp. 3001–3006, Journal of Applied Physics 80, Jul. 1, 1996, USA M.W. Cole, et al.

Post Growth Rapid Thermal Annealing of GaN: the Relationship Between Annealing Temperature, GaN Crystal Quality, and Contact–GaN Interfacial Structure, Applied Physics Letters, Nov. 17, 1997, USA M.W. Cole, et al.

Ohmic Contacts to Si–implanted and Un–implanted n–type Gain, pp. 855–860, Material Research Society Symposium Proceedings 395, Pittsburgh, Pa, J. Brown et al (No Month/Date).

New Buffer Layers for Gan on Saphire by Atomic Layer and Molecular Stream Epitaxy, pp. 307–312, Material Research Society Symposium Proceedings 395, Pittsburgh, Pa E.L. Piner, et al (No Month/Date).

Annealing Study of Ion Implanted MOCVD and MBE Grown GaN, pp. 813–817, Material Research Society Symposium Proceedings 395, Pittsburgh, Pa E. Silkowski, et al (No Month/Date).

Ohmic Contact Formation to Doped GaN, pp. 861–866, Material Research Society Symposium Proceedings 395, Pittsburgh, Pa L.L. Smith (No Month/Date).

Interfacial Reactions Between Metal Thin Films and p–GaN, pp. 819–824, Material Research Society Symposium Proceedings 395, Pittsburgh, Pa J.T. Trexler, et al (No Month/Date).

Thermal Stability of Ohmic Contacts To n–In Ga N, pp. 825–830, Material Research Society Symposium Proceedings 395, Pittsburgh, Pa A. Burbha, et al (No Month/Date).

* cited by examiner

Primary Examiner—Archene Turner
(74) Attorney, Agent, or Firm—Paul S. Clohan, Jr.; Mark Kelly; William E. Eshelman

(57) ABSTRACT

A GaN epilayaer grown on a lattice mismatched saphire substrate is subjected to rapid thermal processing in order the reduce the defect density especially in the proximate the top (device) surface of the GaN epilayer.

20 Claims, 3 Drawing Sheets

LOW DEFECT DENSITY GALLIUM NITRIDE EPILAYER AND METHOD OF PREPARING THE SAME

FIELD OF THE INVENTION

This invention pertains to the treatment of Gallium Nitride used in semiconductor fabrication.

BACKGROUND OF THE INVENTION

Gallium Nitride (GaN) is a semiconductor material which has lately been the subject of much attention by workers in the semiconductor arts. A key feature of this semiconductor material is the high bandgap (3.4 eV) which leads to two other desirable properties.

First the optoelectronic activity of this material is in the blue region of the spectrum. This is desirable to complement already existing optoelectronic materials which have optoelectronic activity in the red and green spectral regions in order to obtain a set of color sources or detectors which can nearly span the range of perceptible colors. Optoelectronic activity in the blue region is desirable, of its own right, because optical systems based on the smaller wavelength blue spectral region would have higher resolution capability. For example a GaN based semiconductor laser could be used in an optical disk system to achieve greatly increased data density.

Second the high band gap, allows for high temperature operation with out swamping the conduction band with thermally generated carriers. High temperature operation may arise in high power applications and medium power applications where the thermal management of the electronics is constrained by mechanical design constraints e.g. servo drive electronics located in a confined space.

Currently GaN semiconductors (e.g. devices) are not prepared from bulk GaN wafers or the like, as is silicon. Such bulk electronic quality GaN is not widely available. Rather GaN epitaxial layers (epilayers) are deposited by chemical vapor deposition (CVD) or metal-organic chemical vapor deposition (MOCVD) on a substrate of another material. Even if GaN wafers were available epitaxial layer deposition has other advantages which might recommend its use. It may be desirable to deposit a number of different semiconductor layers sequentially on a different material substrate in making a so called heterostructure device, or in making microwave integrated circuits it may be desirable to deposit the semiconductor material on a dielectric substrate, or it may be desirable for thermal management to use a thermally stable high thermal conductivity substrate rather than using bulk GaN.

A major problem which arises in conjunction with epitaxial GaN is the lack of a suitable inexpensive substrate which has a good lattice constant match to GaN. A good lattice match exists when the dimensions of the crystal lattice unit cell (in the directions parallel the interface surface) of the substrate and the crystalline material to be deposited (e.g. GaN) correspond (e.g. are equal). Silicon carbide and GaN match better (3% difference), however sufficient quality silicon carbide substrates are very expensive.

The epitaxial growth process can be divided into three stages. Initially isolated islands of the epitaxial material form, next the islands coalesce, and then bulk film growth takes place as more material accumulates on the surface.

When there is a poor lattice match, the epitaxial layer that is grown will have a high concentration of defects. These defects arise because different isolated portions of the initially deposited GaN (e.g. the islands) are aligned locally to the sapphire substrate crystal lattice. However because of the substrate-epitaxial layer lattice mismatch, the alignment of the many isolated portions are not consistent with each other, and they can not form a unified crystal and at the same time maintain their local alignment/adhesion to the sapphire. That is, translation symmetry operations corresponding to the GaN crystal does not describe the location and orientation of the isolated islands because they are aligned to the substrate which has a lattice mismatch vis-a-vis the GaN.

In practice, the defect concentration is highest near the substrate interface, and decreases toward the top of the epitaxial layer. The electronic devices (e.g. vertical (planar) bipolar junction transistors, field effect transistors, light emitting diodes, lasers) which are to be fabricated out of the GaN are fabricated in or on the top of GaN layer which may be appropriately doped to make n or p type semiconductor as is known in the art. The device region may extend into the epitaxial layer to a certain depth, e.g. $0.1\mu$. It is important that the top portion of the epitaxial layer which contains the device structures to be as defect free as possible because the defects can adversely affect manufacturing yield, device performance, and device lifetime. Crystal defects can allow metalization spiking into the device and even punch through device junctions leading to a non working device (reduced manufacturing yield) or a premature device failure. Defects can act as pathways for enhanced undesirable thermal migration of dopants, by which dopants migrate, leading to inaccurate doping profiles and poor device performance or device failure. The latter two problems would be aggravated in high power and perforce high temperature applications. Defects can also act as recombination-generation (R-G) centers which adversely affect carrier lifetimes and thereby device performance. In sum, reducing defect density in the upper (device) strata of epitaxial layers is desirable for electronic device fabrication.

Sapphire (hexagonal $Al_2O_3$) is a readily available, high quality, inexpensive substrate material that offers good thermal stability and thermal conductivity. Unfortunately there is a large lattice mismatch (14%) between GaN and sapphire.

Referring to FIG. 3 a dark field transmission electron micrograph TEM photo is shown. This photo depicts a GaN epitaxial layer grown on a sapphire substrate which is below the border of the image (not shown). Also depicted is a tungsten silicide (WSi) metallization layer on top of the GaN epilayer. In this photo the thin vertically oriented white lines extending from the WSi layer into GaN is metal spiking of the WSi into the GaN which has been facilitated by the high defect density in the GaN layer. This extent of spiking is unacceptable for semiconductor device fabrication.

One prior art method used to reduce the defect density of GaN grown on sapphire stemming from the lattice mismatch is to first deposit a more amorphous (non crystalline) layer of GaN on the sapphire substrate. This thin layer is crystallized by a ramped thermal process, then an in situ doped GaN epilayer is grown. This epilayer has a high defect density. The present invention is intended to reduce the defect density beyond what is achieved with the forgoing technique.

SUMMARY OF THE INVENTION

According to the present invention a process comprising a thermal treatment step is used to obtain a lower defect density in at least a portion of an epitaxial layer GaN deposited on a substrate which has a lattice mismatch with respect to GaN.

According to a further aspect of the invention a post growth, rapid thermal processing (RTP) treatment step is used to obtain a lower defect density in at least a portion of an epitaxial layer GaN deposited on a substrate which has a lattice mismatch with respect to GaN.

According to a still further aspect of the invention a lattice mismatched substrate bearing a layer of GaN is subjected to heating to a temperature of at least 600 C., preferably at least about 700, for a time sufficient to obtain a substantial reduction in defect density.

Although not wishing to be bound by any theory, applicant would like to make note of certain general principles which will guide the worker in the art in varying the time and temperature (time-temperature (t-T) profile) of the treatment. In general the time temperature profile is the graph of the temperature to which the sample is subjected as a function of time during the processing. The annealing out of growth related defects in GaN occurs by mechanisms which are not at present understood in detail, yet are expected follow certain rate laws given by one or more Arrehnious equations including, at present unknown, pre-exponential factor and activation energies. The defect annealing process may include sequential atomic arrangement transformations in which case the overall rate would be determined by the slowest or a number of alternative pathways to defect annealing may exist in which case the rate would be dominated by the fastest. In any case the expectation is the defect elimination follows some type of rate equation which has a monotonically increasing dependance on temperature. Thus the process of the invention might be accomplished by a furnance anneal (FA) (e.g. multiwafer tube furnace) in which the epitaxial GaN layer is exposed to a somewhat lower temperature for a longer period of time than for the case of rapid thermal annealing or in the opposite extreme it may be implemented using laser annealing (LA) in which a pulse or CW laser of high intensity is scanned over the surface of the sample to rapidly heat portions of the sample. In the latter case the temperatures reached may be very high, (i.e. just below the melting point) and the duration may be very short. The preferred embodiment contemplated by the inventors at this time is RTP. RTP ordinarily involves temperature on the of approximately 500 to 1200 C. and processing times from 10 Seconds to 3 minutes.

For any of the above three mentioned types of thermal treatment: RTP, FA, or LA, the worker in the art would by routine experimentation i.e. by setting up a matrix of tests, using different power (corresponding to temperature) and durations determine an appropriate level of time and temperature requisite for the desired degree of defect density reduction. For the laser annealing in particular the effect of decreasing the scan rate would be to increase the time that a given portion of the material is subject to the heating process and to increase the temperature reached. In laser annealing the temperature ordinarily does not reaches the steady state temperature i.e. the peak temperature that would be reached if the beam were fixed on a certain spot.

It is an object of the invention to provide a method for reducing the defect density proximate the top (device) surface of a crystalline film epitaxially grown on substrate where there is a lattice mismatch between the crystal structure of the film material and the crystal structure of the substrate material.

It is an object of the invention to provide a method for reducing the defect density in an epitaxially grown film of GaN.

It is a further object of the invention to provide a method for reducing the defect density in an epitaxially grown film of GaN grown on a sapphire substrate.

It is a further object of the invention to provide an article useful as an intermediate for manufacturing discrete circuit elements or integrated circuits comprising a substrate, preferably sapphire, which has a lattice mismatch with respect to GaN, and a GaN layer deposited on said substrate, characterized in that said GaN layer has a relatively low defect density at a top layer surface thereof.

DETAILED DESCRIPTION OF THE BEST MODE

A process for preparing the GaN films which were subjected to the thermal treatment according to the invention will now be described. In the following process MOCVD is used to deposit the epitaxial GaN film. MOCVD is one option for depositing the film, and should not be construed as limiting.

A single crystal saphire substrate, having the c-axis of hexagonal crystal system aligned perpendicular to deposition surface was obtained. The substrate was cleaned by immersion in a beaker of
1:1:1 HCL:HNO3:H2O solution at room temperature for 10 minutes.

The substrate was then inserted into a Discovery 180 model metal-organic chemical vapor deposition (MOCVD) reactor manufactured by EMCORE of Somerset, N.J. This reactor is equipped with a rotating substrate holder. The substrate temperature was then raised to 1070 C. while Hydrogen gas was flown throught the reactor. The latter step is a final cleaning step, as is known in the art.

The temperature was then reduced to between 480 and 530, and Tri-methyl-Gallium (TMG) is flowed through the chamber at between 80 and 120 micro mole/min; and ammonia ($NH_3$) is flowed through the chamber at 4–20 liters/minute. The total pressure in the reactor was between 30 and 300 torr. Under these conditions an 0.3 micron thick amorphous GaN layer was deposited. This thin layer was then crystallized via a ramped thermal process.

The temperature was then increased to approximately 1050 C. while changing the flow rate of the TMG to between 150 and 250 micro mole/min and that of $NH_3$ to between 4 and 20 l/min, while sustaining a total pressure in the growth chamber of between 30 and 300 torr. The latter conditions resulted in growth a crystalline albeit high defect density film at a rate of 2–3 microns per hour. During the film growth the substrate table rotation rate was set at between 700–1200 RPM The defect density in the gallium nitride film obtained by the foregoing process was unacceptably high for electronic device fabrication purposes.

Figure 3:
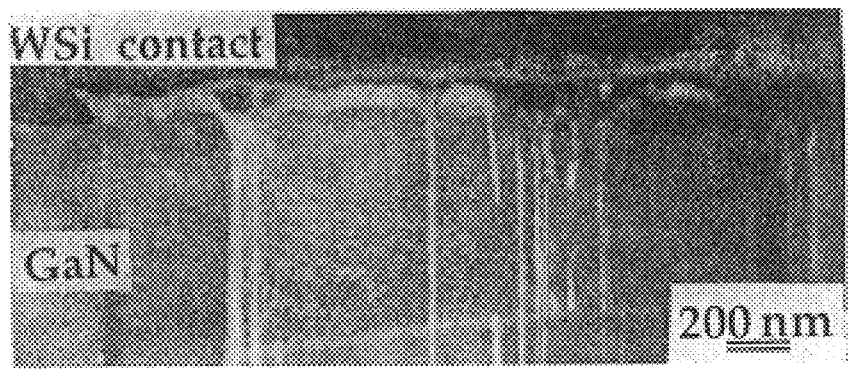
FIG. 3 is a dark field cross section transmission electron micrograph of a thin film structure comprising a, a GaN layer on a sapphire substrate (not shown), and a tungsten salacity layer on the GaN, as grown without the treatment taught by this invention.

After depositing the GaN epitaxial film as described above, a 500 angstrom thick tungsten silicide (WSi) film was deposited on top of the GaN. The tungsten silicide film is useful as a realistic diagnostic of the quality i.e. defect density of the top device layers of the GaN. Tungsten silicide is one type of metalization which may be used in the fabrication of ohmic contacts for GaN semiconductor devices, therefore the feasability of laying down a good quality WSi film on GaN is important in its self. If the defect density in the top of the GaN epilayer is high, the defects will promote a high level of metal penetration, (known as 'spiking' in the art) into the GaN. The amount of this spiking which can be seen in transmission electron micrographs (TEM) is an indication of the defect density in the GaN. Thus the as deposited sample shown in FIG. 3 shows extensive spiking of the WSi into the GaN.

The WSi film was deposited in an MRC 5001 sputtering chamber from a (5:3.9) WSi target, using an Argon discharge and a 90V acceleration voltage. Prior to sputtering the native oxide formed on the GaN was removed from the sample by rinsing the samples in a 20:1 H20:NH4OH solution for 5 min.

Figure 1A:
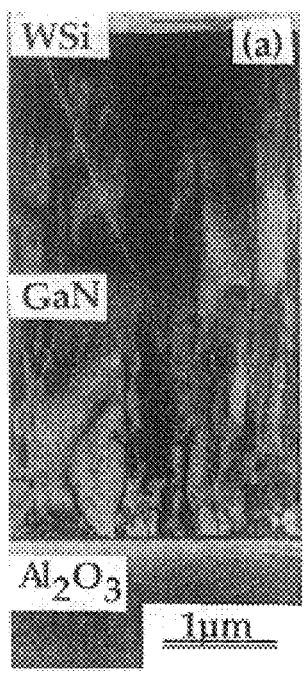
FIG. 1a is a bright field cross section transmission electron micrograph of a thin film structure comprising a sapphire substrate, a GaN layer on the sapphire, and a tungsten silicide layer on the GaN, which is has been subjected to a RTP treatment at 600 C. for 60 seconds.
Figure 1B:
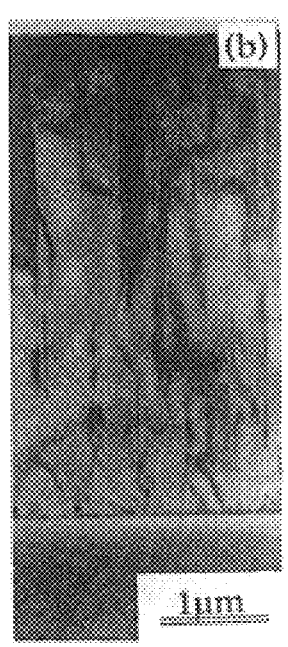
FIG. 1b is a bright field cross section transmission electron micrograph of a thin film structure comprising a sapphire substrate, a GaN layer on the sapphire, and a tungsten salacity layer on the GaN, which is has been subjected to a RTP treatment at 800 C. for 60 seconds.
Figure 2:
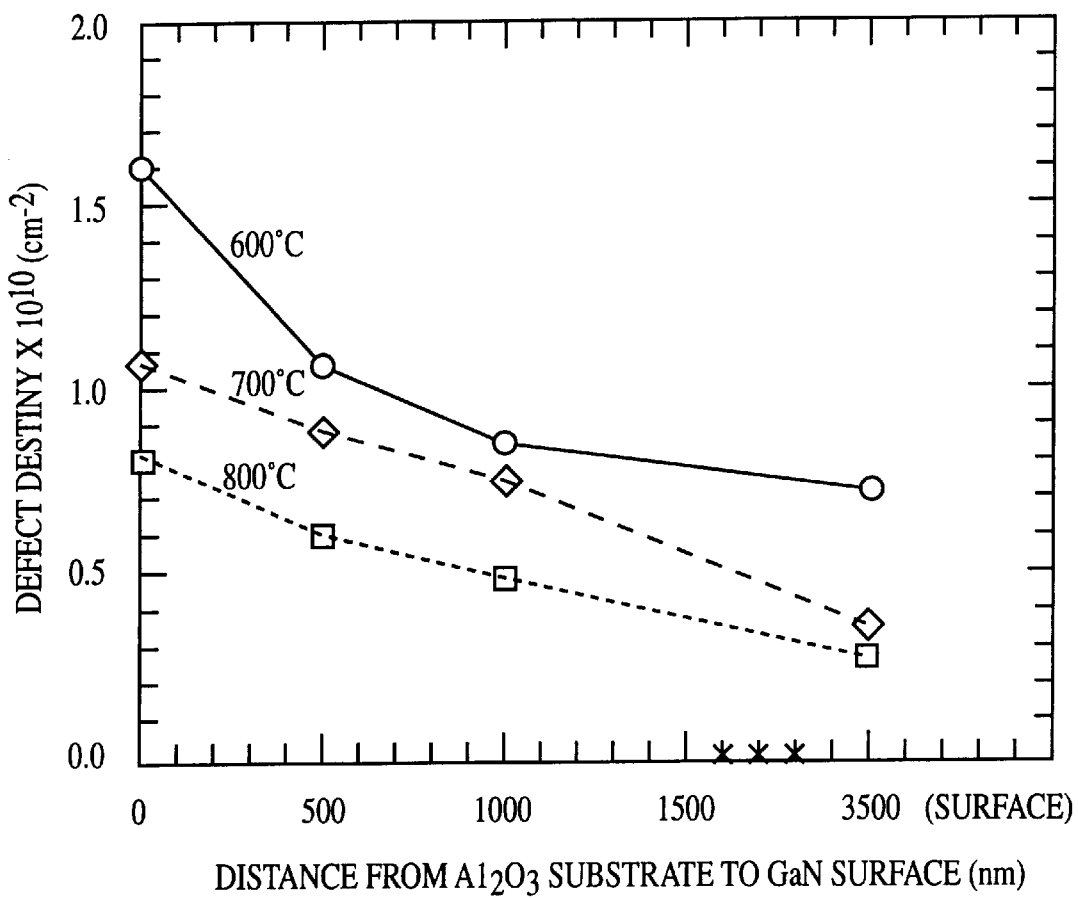
FIG. 2 is a profile of defect density vs. depth for a 3 samples which were subjected to rapid thermal processing at 600 C., 700 C., and 800 C. for 1 minute.

The thermal treatment according to the present invention will now be described with reference to the figures. Referring to FIG. 2, in particular, three defect density profiles for GaN epilers, grown as described above, and treated as will shortly be described, are shown. In these graphs the absicassa inidicates the distance in the GaN epilayer from saphire substrate interface in a direction normal to the interface; the Y axis measures the defect density as determined by transmission electron microscopy. Quantification of defect density was determined from the line intersect method known to those skilled in the art. The three profiles shown on the graphs represent the defect density of three samples treated to rapid thermal treatment at three different temperatures: 600 C., 700 C., and 800 C., as labled on the graph, for 60 seconds.

As seen on the graph, in each case the defect density is greatest at the saphire interface and decreases monotonically toward the GaN surface. In all cases the defect density at and near the surface (the region important for electronic device fabrication) is lower than $1 \times 10^{10}$ cm$^{-2}$. For the samples treated at 700 C. and 800 C. the defect density near the device surface is less than $5 \times 10^9$ cm$^{-2}$. On the graph the GaN surface is at 3500 nm on the X-axis, given that the film thickness was 3.5 microns.

The time temperature profile in each case consists a rapid temperature ramps which brings the sample up to the quoted temperature (e.g 600, 700, or 800) in less than one second by operating the RTP machine in a manner known to those skilled in the art, and a subsequent 60 second hold at the quoted temperature, and a natural cool down period of a few seconds after the power of the RTP machine has been turned off. It should be noted that any of the several commercially available RTP machines is expected to give equivalent suitable performance in carrying out the present invention. Such RTP machines are available from AG associates of San Jose, Calif. and Applied Materials of Santa Clara, Calif. The samples to which the inventive treatment was applied as discussed above were small in size i.e. less than a square centimeter, so temperature non uniformity across the sample was not a concern in conducting the RTP treatment. In applying the inventive method to larger wafer size GaN epilayer samples it is expected that more conservative heating rates will be necessitated, in as much as, the maximum heating rate is somewhat limited by the ability of the particular RTP machine to maintain uniformity as the wafer is heated. These rates ordinarilly lie in the range of 25–100 C. per second. In production, it is desirable to minimize the time taken to heat and cool the wafer as well, in order to maximize the throughput of the rapid thermal treatment machine. Minimizing these times may also be desirable from the standpoint of minimizing the so called 'thermal budget' of the process, as is known in the art. Thermal budget is a somewhat inexact term which is in one sense a time integral involving the temperature of the semiconductor device throughout its processing which indicates the extent of certain deleterious processes e.g. undesirable dopant migration, which take place during various manufacturing processes which involve heating the semiconductor. The limit on minimizing these temperatures is the limitation of the rapid thermal machines to maintain temperature uniformity accross the semiconductor (ordinarily in the form of a wafer) while heating it at a high rate, as previously mentioned.

The cooling off may be accelerated if the wafer is transferred to cold chuck upon removal from the RTP machine processing chamber.

The term lattice mismatch, includes any non exact match between the interfacial lattice parameters.

We claim:

1. A device structure comprising
   a GaN epilayer having a surface defect density of less than $1.5 \times 10^{10}$ cm$^{-2}$,
   a substrate on which said GaN epitaxial layer is deposited characterized in that there is lattice mismatch between said substrate and said GaN epilayer,
   wherein said structure is produced by a method comprising a step of depositing said GaN, on said substrate to form a GaN bearing substrate, and a subsequent step of heating said GaN bearing substrate according to a predetermined time-temperature profile.

2. A structure according to claim 1 wherein said time-temperature profile comprises
   maintaining the temperature of said GaN bearing substrate at a temperature of at least of 600 C. for at least 10 seconds and said suraface defect density is less than $1.0 \times 10^{10}$ cm$^{-2}$.

3. A structure according to claim 1 wherein said time temperature profile comprises
   maintaining the temperature of said GaN bearing substrate at a temperature of at least 600 C. for at least 50 seconds.

4. A structure according to claim 1 wherein said time temperature profile comprises
   maintaining the temperature of said GaN bearing substrate at a temperature of at least 700 C. for at least 10 seconds.

5. A structure according to claim 1 wherein said time temperature profile comprises
   maintaining the temperature of said GaN bearing substrate at a temperature of at least of 700 C. for at least 50 seconds and said suraface defect density is less than $1.0 \times 10^{10}$ cm$^{-2}$.

6. A structure according to claim 1 wherein said substrate is saphire.

7. A structure according to claim 2 wherein said substrate is saphire.

8. A structure according to claim 3 wherein said substrate is saphire.

9. A structure according to claim 4 wherein said substrate is saphire.

10. A structure according to claim 5 wherein said substrate is saphire.

11. A method of treating a GaN epilayer born on a substrate to reduce the defect density in at least a top porti thereof after deposition of the GaN epilayer has been concluded comprising a step of heating the GaN bearing substrate according to a predetermined time temperature profile.

12. A method according to claim 11 wherein said time temperature profile comprises maintaining the temperature of said GaN bearing substrate at a temperature of at least of 600 C. for at least 10 seconds.

13. A method according to claim 11 wherein said time temperature profile comprises maintaining the temperature of said GaN bearing substrate at a temperature of at least of 600 C. for at least 30 seconds.

14. A method according to claim 11 wherein said time temperature profile comprises maintaining the temperature of said GaN bearing substrate at a temperature of at least of 700 C. for at least 10 seconds.

15. A method according to claim 11 wherein said time temperature profile comprises maintaining the temperature of said GaN bearing substrate at a temperature of at least of 700 C. for at least 30 seconds.

16. A method according to any of claim 11, wherein said substrate is saphire.

17. A method according to any of claim 12, wherein said substrate is saphire.

18. A method according to any of claim 13, wherein said substrate is saphire.

19. A method according to any of claims 14, wherein said substrate is saphire.

20. A method according to any of claims 15, wherein said substrate is saphire.

* * * * *